United States Patent
Minzoni et al.

(10) Patent No.: US 7,469,354 B2
(45) Date of Patent: Dec. 23, 2008

(54) CIRCUIT INCLUDING A DESKEW CIRCUIT FOR ASYMMETRICALLY DELAYING RISING AND FALLING EDGES

(75) Inventors: Alessandro Minzoni, Morrisville, NC (US); Jungwon Suh, Apex, NC (US)

(73) Assignee: Infineon Technologies AG, Munich (DE)

( * ) Notice: Subject to any disclaimer, the term of this patent is extended or adjusted under 35 U.S.C. 154(b) by 496 days.

(21) Appl. No.: 11/111,140

(22) Filed: Apr. 21, 2005

(65) Prior Publication Data

US 2006/0242448 A1   Oct. 26, 2006

(51) Int. Cl.
*G06F 1/04*   (2006.01)
(52) U.S. Cl. ........................ 713/503; 365/194
(58) Field of Classification Search ............... 713/500, 713/501, 502, 503; 365/194
See application file for complete search history.

(56) References Cited

U.S. PATENT DOCUMENTS

| | | | |
|---|---|---|---|
| 6,031,847 A | 2/2000 | Collins et al. | |
| 6,499,111 B2 | 12/2002 | Mullarkey | |
| 6,536,025 B2 | 3/2003 | Kennedy et al. | |
| 6,704,881 B1* | 3/2004 | Li et al. | 713/401 |
| 6,829,316 B1* | 12/2004 | Terada et al. | 375/355 |
| 2002/0087922 A1* | 7/2002 | Glenn et al. | 714/700 |
| 2002/0186717 A1 | 12/2002 | Haq et al. | |
| 2003/0081709 A1 | 5/2003 | Ngo et al. | |
| 2003/0229466 A1* | 12/2003 | Garcia | 702/117 |
| 2004/0008730 A1* | 1/2004 | Helzer | 370/505 |
| 2004/0068682 A1* | 4/2004 | Takei et al. | 714/700 |
| 2004/0148538 A1* | 7/2004 | Li et al. | 713/401 |
| 2005/0024926 A1 | 2/2005 | Mitchell et al. | |
| 2005/0044441 A1* | 2/2005 | Sohn et al. | 713/503 |
| 2005/0058233 A1* | 3/2005 | Nguyen et al. | 375/354 |

* cited by examiner

*Primary Examiner*—Thomas Lee
*Assistant Examiner*—Albert Wang
(74) *Attorney, Agent, or Firm*—Dicke, Billig & Czaja, PLLC

(57) ABSTRACT

A circuit including a deskew circuit. The deskew circuit is configured to receive a first signal having a first edge delayed from a second edge of a second signal by a first delay and a third edge delayed from a fourth edge of the second signal by a second delay. The deskew circuit is configured to provide a third signal having a first deskewed edge delayed from the first edge by a third delay and a second deskewed edge delayed from the third edge by a fourth delay. The difference between the fourth delay and the third delay is substantially equal to the difference between the first delay and the second delay.

28 Claims, 7 Drawing Sheets

CIRCUIT INCLUDING A DESKEW CIRCUIT FOR ASYMMETRICALLY DELAYING RISING AND FALLING EDGES

BACKGROUND

Typically, a computer system includes a number of integrated circuit chips that communicate with one another to perform system applications. Often, the computer system includes a controller, such, as a micro-processor, and one or more memory chips, such as random access memory (RAM) chips. The RAM chips can be any suitable type of RAM, such as dynamic RAM (DRAM), double data rate synchronous DRAM (DDR-SDRAM), graphics DDR-SDRAM (GDDR-SDRAM), and pseudo static RAM (PSRAM). The controller and RAM communicate data with one another to perform system applications.

Some computer systems include mobile applications and have limited space and limited power resources. In mobile applications, such as cellular telephones and personal digital assistants (PDAs), memory cell density and power consumption are issues for future generations. To address these issues, the industry is developing RAM for mobile applications. One type of RAM, referred to as CellularRAM, is a high performance and low power memory designed to meet memory density and bandwidth demands of future generations. CellularRAM is a PSRAM that offers static RAM (SRAM) pin and function compatibility, external refresh-free operation, and a low power design. CellularRAM devices are drop-in replacements for most asynchronous low power SRAMs used in mobile applications, such as cellular telephones. Typically, a PSRAM is based on a DRAM that provides significant advantages in density and speed over traditional SRAM.

As chip speeds continue to increase, the amount of data communicated between chips continues to increase to meet the demands of system applications. Typically data is received at an integrated circuit, such as a RAM, and sampled via a strobe signal that is also received at the integrated circuit. Higher bandwidth communication links can be built by increasing input/output (I/O) data bit and strobe signal speeds. However, increasing I/O data bit and strobe signal speeds can lead to problems with signal skew through the receivers of the integrated circuit.

The rising edges of the data and strobe signals propagate through the receivers at different speeds than the falling edges of the data and strobe signals. Also, process variations, temperature variations, and voltage variations can increase signal skew through the receivers. Skewed data and strobe signals contribute to setup and hold window shifts during sampling of the data and data recovery in the integrated circuit. Improved receiver performance can be attained via more complex designs, but at the cost of circuitry that may not be reliable and an increase in power consumption.

For these and other reasons there is a need for the present invention.

SUMMARY

One aspect of the present invention provides a circuit including a deskew circuit. The deskew circuit is configured to receive a first signal having a first edge delayed from a second edge of a second signal by a first delay and a third edge delayed from a fourth edge of the second signal by a second delay. The deskew circuit is configured to provide a third signal having a first deskewed edge delayed from the first edge by a third delay and a second deskewed edge delayed from the third edge by a fourth delay. The difference between the fourth delay and the third delay is substantially equal to the difference between the first delay and the second delay.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
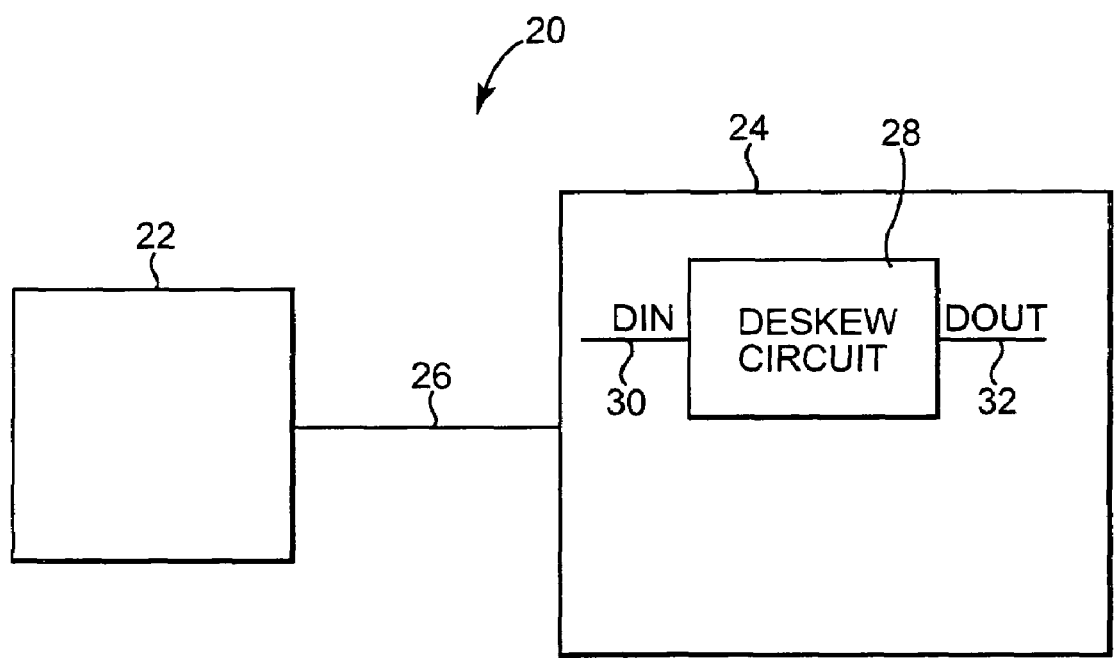
FIG. 1 is a block diagram illustrating one embodiment of a computer system according to the present invention.

FIG. 1 is a block diagram illustrating one embodiment of a computer system 20 according to the present invention. The computer system 20 includes a first integrated circuit chip 22 and a second integrated circuit chip 24. Chip 22 is electrically coupled to chip 24 via communications path 26. In one embodiment, chip 22 is a memory controller and chip 24 is a RAM, such as a DRAM, a DDR-SDRAM, a GDDR-SDRAM, or a PSRAM. The controller and RAM communicate with one another to perform system applications. In other embodiments, chip 22 and chip 24 can be any suitable chips that communicate with one another.

Chip 22 includes a suitable number of transmitter and receiver pairs and chip 24 includes a suitable number of transmitter and receiver pairs. Each transmitter and receiver pair in chip 22 corresponds to a transmitter and receiver pair in chip 24. Communications path 26 includes one or more signal pathways and each transmitter and receiver pair in chip 22 is electrically coupled to the corresponding transmitter and receiver pair in chip 24 via at least one of the signal pathways in communications path 26.

Chip 24 includes a deskew circuit 28 that receives a deskew input signal DIN at 30 and provides a deskewed output signal DOUT at 32. A base signal includes first edges, such as one of rising edges or falling edges, and second edges, such as the other of rising edges or falling edges. The deskew input signal DIN at 30 includes third edges, such as one of rising edges or falling edges, and fourth edges, such as the other of rising edges or falling edges. Each of the third edges is delayed from one of the first edges by a first delay and each of the fourth edges is delayed from one of the second edges by a second delay. The deskew input signal DIN at 30 is provided by chip 22 or via a circuit, such as one of the receivers, in chip 24 to deskew circuit 28.

The deskewed output signal DOUT at 32 includes first deskewed edges, such as one of rising edges or falling edges, and second deskewed edges, such as the other of rising edges or falling edges. Each of the first deskewed edges is delayed from one of the third edges by a third delay and each of the second deskewed edges is delayed from one of the fourth edges by a fourth delay. The first delay plus the third delay is substantially equal to the second delay plus the fourth delay. Also, the difference between the fourth delay and the third delay is substantially equal to the difference between the first delay and the second delay.

Deskew circuit 28 provides the third delay and the fourth delay to offset the first delay and the second delay between edges of the base signal and edges of deskew input signal DIN at 30. The deskewed output signal DOUT at 32 is substantially the same as the base signal. Deskew circuit 28 can be built to compensate for the first delay and the second delay between the edges of the base signal and edges of deskew input signal DIN at 30 over process variations, temperature variations, and voltage variations.

In one embodiment, chip 24 includes a suitable number of deskew circuit 28 and receiver pairs that receive data and strobe signals provided by chip 22 to chip 24 via communications path 26. Each of the receivers in chip 24 receives one of the data and strobe signals and delays the edges of the received signal to provide a receiver skewed data or strobe output signal. Each of the receiver skewed data or strobe output signals is provided to one of the deskew circuits 28 as a deskew input signal DIN at 30. Each of the deskew circuits 28 provides the third delay and the fourth delay to offset the receiver skew in the skewed data or strobe output signal. The deskewed output signal DOUT at 32 is substantially the same as the data or strobe signal received by chip 24 and the setup and hold windows are substantially stable during sampling of the data and data recovery in chip 24. Deskew circuit 28 is reliable and consumes little power in comparison to more complex receiver designs.

Figure 2:
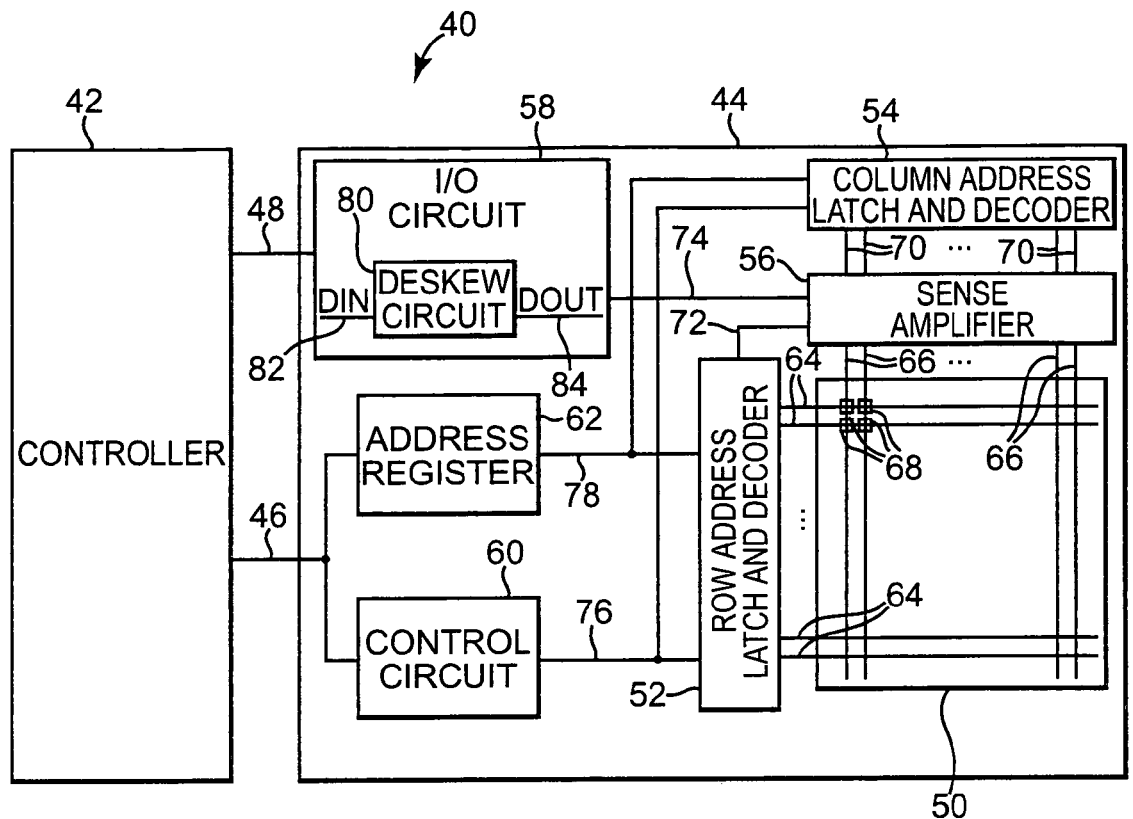
FIG. 2 is a block diagram illustrating one embodiment of a computer system according to the present invention, including a controller and a RAM.

FIG. 2 is a block diagram illustrating one embodiment of a computer system 40 according to the present invention. Computer system 40 includes a controller 42 and a RAM 44. Controller 42 is electrically coupled to RAM 44 via memory communications path 46 and data communications path 48. Controller 42 provides row and column addresses and control signals to RAM 44 via memory communications path 46. Controller 42 provides data and strobe signals to RAM 44 and receives data and strobe signals from RAM 44 via data communications path 48. RAM 44 can be any suitable type of RAM, such as a DRAM, a DDR-SDRAM, a GDDR-SDRAM, or a PSRAM. In one embodiment, RAM 44 is a DRAM, such as a fourth generation DDR SDRAM (DDR4 SDRAM), a third generation GDDR SDRAM (GDDR3 SDRAM), a fourth generation GDDR SDRAM (GDDR4 SDRAM), or a later generation of DRAM.

RAM 44 includes an array of memory cells 50, a row address latch and decoder 52, a column address latch and decoder 54, a sense amplifier circuit 56, a RAM I/O circuit 58, a control circuit 60, and an address register 62. Conductive word lines 64, referred to as row select lines, extend in the x-direction across the array of memory cells 50. Conductive bit lines 66, referred to as digit lines, extend in the y-direction across the array of memory cells 50. A memory cell 68 is located at each cross point of a word line 64 and a bit line 66.

Each word line 64 is electrically coupled to row address latch and decoder 52 and each bit line 66 is electrically coupled to one of the sense amplifiers in sense amplifier circuit 56. The sense amplifier circuit 56 is electrically coupled to column address latch and decoder 54 via conductive column select lines 70. Also, sense amplifier circuit 56 is electrically coupled to row address latch and decoder 52 via communications path 72 and to RAM I/O circuit 58 via I/O communications path 74. RAM I/O circuit 58 is electrically coupled to controller 42 via data communications path 48. Data and strobe signals are transferred between RAM I/O circuit 58 and controller 42 via data communications path 48.

Controller 42 is electrically coupled to RAM I/O circuit 58 via data communications path 48 and to control circuit 60 and address register 62 via memory communications path 46. Control circuit 60 is electrically coupled to row address latch and decoder 52 and column address latch and decoder 54 via control communications path 76. Address register 62 is electrically coupled to row address latch and decoder 52 and column address latch and decoder 54 via row and column address lines 78.

Address register 62 receives row and column addresses from controller 42 via memory communications path 46. Address register 62 supplies a row address to row address latch and decoder 52 via row and column address lines 78, and control circuit 60 supplies a RAS signal to row address latch and decoder 52 via control communications path 76 to latch the supplied row address into row address latch and decoder 52. Address register 62 supplies a column address to column address latch and decoder 54 via row and column address lines 78, and control circuit 60 supplies a CAS signal to column address latch and decoder 54 via control communications path 76 to latch the supplied column address into column address latch and decoder 54.

Row address latch and decoder 52 receives row addresses and RAS signals and latches the row addresses into row address latch and decoder 52. Row address latch and decoder 52 decodes each of the row addresses to select a row of memory cells 68. In addition, row address latch and decoder 52 provides sense amplifier activation signals and equalization and precharge signals to sense amplifier circuit 56 via communications path 72.

Column address latch and decoder 54 activates column select lines 70 to connect sense amplifiers in sense amplifier circuit 56 to RAM I/O circuit 58. Column address latch and decoder 54 receives a column address and latches the column address into column address latch and decoder 54. Column address latch and decoder 54 decodes the column address to select addressed column select lines 70. In addition, column address latch and decoder 54 receives column select line activation signals from control circuit 60 via control communications path 76. The column select line activation signals indicate which of the addressed column select lines 70 are to be activated by column address latch and decoder 54. Column address latch and decoder 54 activates column select lines 70 that are addressed by the column address and selected for activation by the column select line activation signals. Activated column select lines 70 are provided to sense amplifier circuit 56 to connect sense amplifiers in sense amplifier circuit 56 to RAM I/O circuit 58.

Control circuit 60 receives addresses and control signals from controller 42 via memory communications path 46. Controller 42 provides control signals, such as read/write enable, RAS, and CAS signals to control circuit 60. Control circuit 60 provides RAS signals to row address latch and decoder 52 and CAS signals to column address latch and decoder 54. Also, control circuit 60 provides control signals to column address latch and decoder 52 to selectively activate column select lines 70.

Controller 42 and RAM I/O circuit 58 communicate data and strobe signals between controller 42 and RAM 44 via data communications path 48. Controller 42 and RAM 44 are similar to chip 22 and chip 24 (shown in FIG. 1). RAM I/O circuit 58 includes a suitable number of transmitter and receiver pairs and controller 42 includes a suitable number of transmitter and receiver pairs. Each transmitter and receiver pair in RAM I/O circuit 58 corresponds to a transmitter and receiver pair in controller 42. Data communications path 48 includes one or more signal pathways and each transmitter and receiver pair in I/O circuit 58 is electrically coupled to the corresponding transmitter and receiver pair in controller 42 via at least one of the signal pathways in data communications path 48.

RAM I/O circuit 58 includes a deskew circuit 80 that receives a deskew input signal DIN at 82 and provides a deskewed output signal DOUT at 84. Deskew circuit 80 is similar to deskew circuit 28 (shown in FIG. 1). A data or strobe signal provided by controller 42 to RAM I/O circuit 58 includes first edges, such as one of rising edges or falling edges, and second edges, such as the other of rising edges or falling edges. A receiver in RAM I/O circuit 58 receives the data or strobe signal and provides, as the receiver output, the deskew input signal DIN at 82 to deskew circuit 80. The deskew input signal DIN at 82 includes third edges, such as one of rising edges or falling edges, and fourth edges, such as the other of rising edges or falling edges. Each of the third edges is delayed from one of the first edges by a first delay and each of the fourth edges is delayed from one of the second edges by a second delay. The first delay and the second delay are signal delays through the receiver.

The deskewed output signal DOUT at 84 includes first deskewed edges, such as one of rising edges or falling edges, and second deskewed edges, such as the other of rising edges or falling edges. Each of the first deskewed edges is delayed from one of the third edges by a third delay and each of the second deskewed edges is delayed from one of the fourth edges by a fourth delay. The third delay and the fourth delay are delays through deskew circuit 80. The first delay plus the third delay is substantially equal to the second delay plus the fourth delay. Also, the difference between the fourth delay and the third delay is substantially equal to the difference between the first delay and the second delay.

Deskew circuit 80 provides the third delay and the fourth delay to offset the first delay and the second delay through the receiver. The deskewed output signal DOUT at 84 has substantially the same timing as the received data or strobe signal, but delayed in time and possibly inverted. Deskew circuit 80 can be built to offset delays through the receiver over process variations, temperature variations, and voltage variations.

In one embodiment, RAM I/O circuit 58 includes a suitable number of deskew circuits 80 and a suitable number of receivers arranged in deskew circuit 80 and receiver pairs that receive the data and strobe signals provided by controller 42 to RAM I/O circuit 58. Each of the receivers in RAM I/O circuit 58 receives one of the data or strobe signals and delays the edges of the received signal to provide a receiver skewed data or strobe output signal. Each of the receiver skewed data or strobe output signals is provided to one of the deskew circuits 80 as a deskew input signal DIN at 82. Each of the deskew circuits 80 provides the third delay and the fourth delay to offset the receiver delays in the skewed data or strobe output signal. The deskewed output signal DOUT at 84 has substantially the same timing as the data or strobe signal received by the receiver from controller 42, but delayed in time and possibly inverted. Setup and hold windows for sampling the data via the strobe signals are substantially unaffected by the skew of the receivers. Deskew circuit 80 is reliable and consumes little power in comparison to more complex receiver designs.

Sense amplifier circuit 56 includes sense amplifiers, equalization and precharge circuits, and switches. The sense amplifiers are differential input sense amplifiers and each sense amplifier receives one bit line 66 at each of the two differential inputs. One of the bit lines 66 receives a data bit from a selected memory cell 68 and the other bit line 66 is used as a reference. The equalization and precharge circuits equalize the voltage on bit lines 66 connected to the same sense amplifier prior to a read or write operation.

To read a data bit, a sense amplifier amplifies the difference between the data bit value and the reference value and provides a sensed output value to RAM I/O circuit 58 via I/O communications path 74. One of the transmitter and receiver pairs in RAM I/O circuit 58 receives the sensed output value and provides the sensed output value to the corresponding transmitter and receiver pair in controller 42 via data communications path 48.

To write a data bit, one of the transmitter and receiver pairs in controller 42 provides data to the corresponding transmitter and receiver pair in RAM I/O circuit 58 via data communications path 48. A receiver in RAM I/O circuit 58 receives the data and provides a skewed data signal to a deskew circuit, such as deskew circuit 80. The deskew circuit provides a deskewed data output signal, such as deskewed output signal DOUT at 84. Also, another one of the transmitter and receiver pairs in controller 42 provides a strobe signal to a corresponding transmitter and receiver pair in RAM I/O circuit 58 via data communications path 48. A receiver in RAM I/O circuit 58 receives the strobe signal and provides a skewed strobe signal to another deskew circuit, similar to deskew circuit 80. The strobe signal deskew circuit provides a deskewed strobe output signal that is used to sample the deskewed data output signal and recover data transmitted from controller 42 to RAM 44. RAM I/O circuit 58 provides a data bit to a sense amplifier in sense amplifier circuit 56 via I/O communications path 74 and overdrives the sense amplifier to drive the data bit value onto the bit line 66 that is connected to one of the memory cells 68. RAM I/O circuit 58 also drives the inverse of the data bit value onto the reference bit line 66. The sense amplifier writes the received data bit value into the selected memory cell 68.

During a read operation, control circuit 60 receives read control signals and address register 62 receives the row address of a selected memory cell or cells 68. The row address is supplied from address register 62 to row address latch and decoder 52 and latched into row address latch and decoder 52 by control circuit 60 and a RAS signal. Row address latch and decoder 52 decodes the row address and activates the selected word line 64. As the selected word line 64 is activated, the value stored in each memory cell 68 coupled to the selected word line 64 is passed to the respective bit line 66. The bit value stored at a memory cell 68 is detected by a sense amplifier that is electrically coupled to the respective bit line 66.

Next, control circuit 60 and address register 62 receive the column address of the selected memory cell or cells 68. The column address is supplied from address register 62 to column address latch and decoder 54 and latched into column address latch and decoder 54 by control circuit 60 and a CAS signal. The column address latch and decoder 54 decodes the column address to select column select lines 70. Control circuit 60 provides control signals to column address latch and decoder 54 to selectively activate column select lines 70 and connect selected sense amplifiers to RAM I/O circuit 58. Sensed output values are provided to transmitter and receiver pairs in RAM I/O circuit 58 and provided to the corresponding transmitter and receiver pairs in controller 42 via data communications path 48.

During a write operation, control circuit 60 receives write control signals and address register 62 receives the row address of a selected memory cell or cells 68. The row address is supplied from address register 62 to row address latch and decoder 52 and latched into row address latch and decoder 52 by control circuit 60 and a RAS signal. The row address latch and decoder 52 decodes the row address and activates the selected word line 64. As the selected word line 64 is activated, the value stored in each memory cell 68 coupled to the selected word line 64 is passed to the respective bit line 66 and the sense amplifier that is electrically coupled to the respective bit line 66.

Data to be stored in the array of memory cells 50 is supplied from transmitter and receiver pairs in controller 42 to transmitter and receiver pairs in I/O circuit 58 via data communications path 48. Receivers in RAM I/O circuit 58 receive the data and provide skewed data signals as deskew input signals to deskew circuits, such as deskew input signal DIN at 82 to deskew circuit 80. The deskew circuits provide deskewed data output signals, such as deskewed output signal DOUT at 84. Other transmitter and receiver pairs in controller 42 provide strobe signals to corresponding transmitter and receiver pairs in RAM I/O circuit 58 via data communications path 48. Receivers in RAM I/O circuit 58 receive the strobe signals and provide skewed strobe signals as deskew input signals to other deskew circuits. The strobe signal deskew circuits provide deskewed strobe output signals that are used to sample the deskewed data output signals and recover the data transmitted from controller 42 to RAM 44.

Control circuit 60 and address register 62 receive the column address of the selected memory cell or cells 68. Address register 62 supplies the column address to column address latch and decoder 54 and the column address is latched into column address latch and decoder 54 by control circuit 60 and a CAS signal. Column address latch and decoder 54 receives column select line activation signals from control circuit 60 and activates selected column select lines 70 to connect sense amplifiers in sense amplifier circuit 56 to RAM 1/O circuit 58. RAM I/O circuit 58 provides recovered data to sense amplifiers in sense amplifier circuit 56 via I/O communications path 74. RAM I/O circuit 58 overdrives the sense amplifiers to write data to the selected memory cell or cells 68 via bit lines 66.

Figure 3:
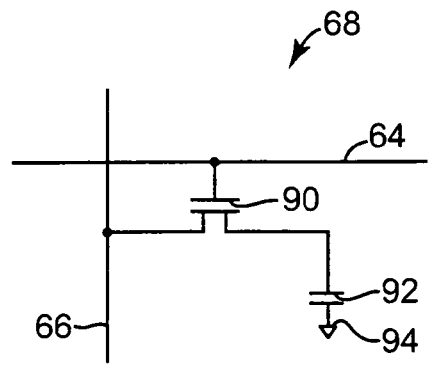
FIG. 3 is a diagram illustrating one embodiment of a memory cell in an array of memory cells.

FIG. 3 is a diagram illustrating one embodiment of a memory cell 68 in the array of memory cells 50. Memory cell 68 includes a transistor 90 and a capacitor 92. The gate of transistor 90 is electrically coupled to a word line 64. One side of the drain-source path of transistor 90 is electrically coupled to a bit line 66 and the other side of the drain-source path is electrically coupled to one side of capacitor 92. The other side of capacitor 92 is electrically coupled to a reference 94, such as one-half the supply voltage. Capacitor 92 is charged and discharged to represent a logic 0 or a logic 1.

During a read operation, word line 64 is activated to turn on transistor 90 and the value stored on capacitor 92 is read by a sense amplifier via bit line 66. During a write operation, word line 64 is activated to turn on transistor 90 to access capacitor 92. The sense amplifier connected to bit line 66 is overdriven to write a data value onto capacitor 92 via bit line 66 and transistor 90.

A read operation on memory cell 68 is a destructive read operation. After each read operation, capacitor 92 is recharged or discharged to the data value that was just read. In addition, even without read operations, the charge on capacitor 92 discharges over time. To retain a stored value, memory cell 68 is refreshed periodically by reading and/or writing memory cell 68. All memory cells 68 in the array of memory cells 50 are periodically refreshed to maintain their values.

Figure 4:
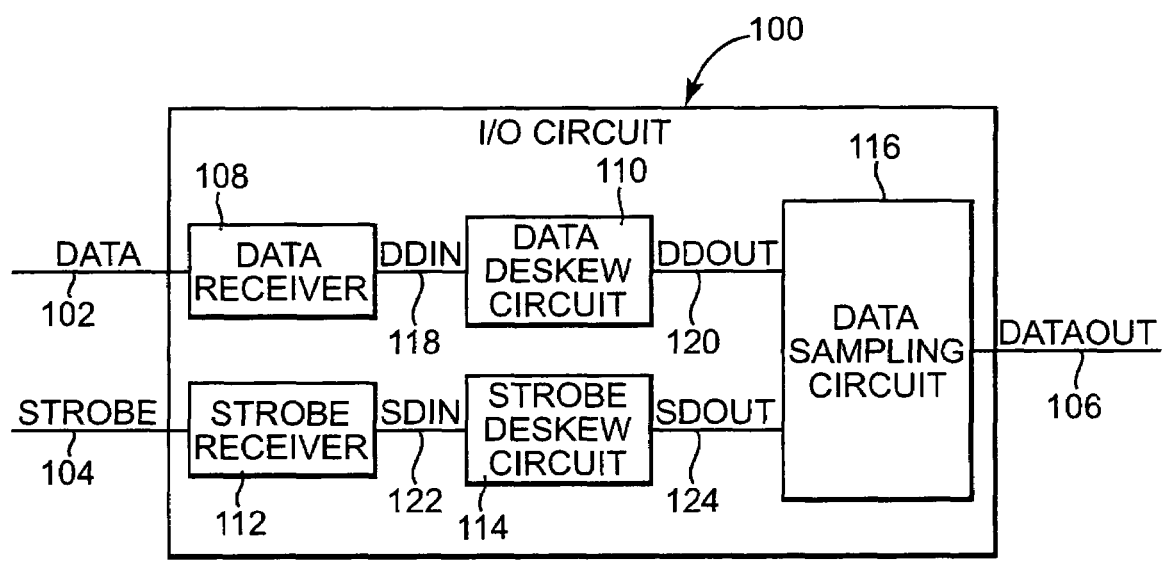
FIG. 4 is a diagram illustrating one embodiment of an I/O circuit.

FIG. 4 is a diagram illustrating one embodiment of an I/O circuit 100. I/O circuit 100 receives a data signal DATA at 102 and a strobe signal STROBE at 104 and provides a data output signal DATAOUT at 106. I/O circuit 100 recovers data in data signal DATA at 102 via strobe signal STROBE at 104 and provides the recovered data in data output signal DATAOUT at 106. Data signal DATA at 102 and strobe signal STROBE at 104 can be provided by any suitable integrated circuit chip, such as chip 22 (shown in FIG. 1) or controller 42 (shown in FIG. 2). I/O circuit 100 can be situated in any suitable integrated circuit chip, such as chip 24 (shown in FIG. 1) or RAM 44 (shown in FIG. 2). In one embodiment, I/O circuit 100 is similar to RAM I/O circuit 58 (shown in FIG. 2).

I/O circuit 100 includes a data receiver 108, a data deskew circuit 110, a strobe signal receiver 112, a strobe signal deskew circuit 114, and a data sampling circuit 116. Data receiver 108 is electrically coupled to data deskew circuit 110 via deskew input communications path 118 and data deskew circuit 110 is electrically coupled to data sampling circuit 116 via deskewed output communications path 120. Data receiver 108 receives data signal DATA at 102 and provides data deskew input signal DDIN at 118. Data deskew circuit 110 receives data deskew input signal DDIN at 118 and provides data deskewed output signal DDOUT at 120 to data sampling circuit 116.

Strobe signal receiver 112 is electrically coupled to strobe signal deskew circuit 114 via deskew input communications path 122 and strobe signal deskew circuit 114 is electrically coupled to data sampling circuit 116 via deskewed output communications path 124. Strobe signal receiver 112 receives strobe signal STROBE at 104 and provides strobe deskew input signal SDIN at 122. Strobe signal deskew circuit 114 receives strobe deskew input signal SDIN at 122 and provides strobe deskewed output signal SDOUT at 124 to data sampling circuit 116.

Data sampling circuit 116 receives data deskewed output signal DDOUT at 120 and strobe deskewed output signal SDOUT at 124 and provides recovered data in data output signal DATAOUT at 106. In one embodiment, I/O circuit 100 includes any suitable number of data receivers 108, data deskew circuits 110, strobe signal receivers 112, strobe signal deskew circuits 114, and data sampling circuits 116 to recover data from any suitable number of data input signals, such as data signal DATA at 102.

Data receiver 108 receives data signal DATA at 102 that includes first data edges, such as one of rising edges or falling edges, and second data edges, such as the other of rising edges or falling edges. Data receiver 108 provides data deskew input signal DDIN at 118 that includes third data edges, such as one of rising edges or falling edges, and fourth data edges, such as the other of rising edges or falling edges. In one embodiment, data receiver 108 is an inverting receiver that provides a falling data edge in data deskew input signal DDIN at 118 in response to each received rising data edge, and a rising data edge in data deskew input signal DDIN at 118 in response to each received falling data edge. In one embodiment, data receiver 108 is a non-inverting receiver that provides a rising data edge in data deskew input signal DDIN at 118 in response to each received rising data edge, and a falling data edge in data deskew input signal DDIN at 118 in response to each received falling data edge.

Data receiver 108 provides a third data edge in data deskew input signal DDIN at 118 in response to each received first data edge, and a fourth data edge in data deskew input signal DDIN at 118 in response to each received second data edge. Data receiver 108 provides a first data delay between each received first data edge in data signal DATA at 102 and the corresponding third data edge in data deskew input signal DDIN at 118, and a second data delay between each received second data edge in data signal DATA at 102 and the corresponding fourth data edge in data deskew input signal DDIN at 118. The first data delay and the second data delay can be different lengths of time, such that the time between a first data edge and a second data edge in data signal DATA at 102 is different than the time between a third data edge and a fourth data edge in data deskew input signal DDIN at 118.

Data deskew circuit 110 is similar to deskew circuit 28 (shown in FIG. 1) and deskew circuit 80 (shown in FIG. 2). Data deskew circuit 110 receives data deskew input signal DDIN at 118 that includes third data edges, such as one of rising edges or falling edges, and fourth data edges, such as the other of rising edges or falling edges. Data deskew circuit 110 provides data deskewed output signal DDOUT at 120 that includes first data deskewed edges, such as one of rising edges or falling edges, and second data deskewed edges, such as the other of rising edges or falling edges. In one embodiment, data deskew circuit 110 is an inverting circuit that provides a falling data edge in data deskewed output signal DDOUT at 120 in response to each received rising data edge in data deskew input signal DDIN at 118, and a rising data edge in data deskewed output signal DDOUT at 120 in response to each received falling data edge in data deskew input signal DDIN at 118. In one embodiment, data deskew circuit 110 is a non-inverting circuit that provides a rising data edge in data deskewed output signal DDOUT at 120 in response to each received rising data edge in data deskew input signal DDIN at 118, and a falling data edge in data deskewed output signal DDOUT at 120 in response to each received falling data edge in data deskew input signal DDIN at 118.

Data deskew circuit 110 provides a first data deskewed edge in data deskewed output signal DDOUT at 120 in response to each received third data edge, and a second data deskewed edge in data deskewed output signal DDOUT at 120 in response to each received fourth data edge. Data deskew circuit 110 provides a third data delay between each received third data edge in data deskew input signal DDIN at 118 and the corresponding first data deskewed edge in data deskewed output signal DDOUT at 120, and a fourth data delay between each received fourth data edge in data deskew input signal DDIN at 118 and the corresponding second data deskewed edge in data deskewed output signal DDOUT at 120. The difference between the fourth data delay and the third data delay is substantially equal to the difference between the first data delay and the second data delay. Also, the first data delay plus the third data delay is substantially equal to the second data delay plus the fourth data delay.

Data deskew circuit 110 provides the third data delay and the fourth data delay to offset differences in the first data delay and the second data delay through data receiver 108. Data deskewed output signal DDOUT at 120 has substantially the same timing as data signal DATA at 102, but delayed in time and possibly inverted. Data deskew circuit 110 can be built to offset differences in delays through data receiver 108 over process variations, temperature variations, and voltage variations.

Strobe signal receiver 112 receives strobe signal STROBE at 104 that includes first strobe edges, such as one of rising edges or falling edges, and second strobe edges, such as the other of rising edges or falling edges. Strobe signal receiver 112 provides strobe deskew input signal SDIN at 122 that includes third strobe edges, such as one of rising edges or falling edges, and fourth strobe edges, such as the other of rising edges or falling edges. In one embodiment, strobe signal receiver 112 is an inverting receiver and strobe signal receiver 112 provides a falling strobe edge in strobe deskew input signal SDIN at 122 in response to each received rising strobe edge, and a rising strobe edge in strobe deskew input signal SDIN at 122 in response to each received falling strobe edge. In one embodiment, strobe signal receiver 112 is a non-inverting receiver and strobe signal receiver 112 provides a rising strobe edge in strobe deskew input signal SDIN at 122 in response to each received rising strobe edge, and a falling strobe edge in strobe deskew input signal SDIN at 122 in response to each received falling strobe edge.

Strobe signal receiver 112 provides a third strobe edge in strobe deskew input signal SDIN at 122 in response to each received first strobe edge, and a fourth strobe edge in strobe deskew input signal SDIN at 122 in response to each received second strobe edge. Strobe signal receiver 112 provides a first strobe delay between each received first strobe edge in strobe signal STROBE at 104 and the corresponding third strobe edge in strobe deskew input signal SDIN at 122, and a second strobe delay between each received second strobe edge in strobe signal STROBE at 104 and the corresponding fourth strobe edge in strobe deskew input signal SDIN at 122. The first strobe delay and the second strobe delay can be different lengths of time, such that the time between a first strobe edge and a second strobe edge in strobe signal STROBE at 104 is different than the time between a third strobe edge and a fourth strobe edge in strobe deskew input signal SDIN at 122.

Strobe signal deskew circuit 114 is similar to deskew circuit 28 (shown in FIG. 1) and deskew circuit 80 (shown in FIG. 2). Strobe signal deskew circuit 114 receives strobe deskew input signal SDIN at 122 that includes third strobe edges, such as one of rising edges or falling edges, and fourth strobe edges, such as the other of rising edges or falling edges. Strobe signal deskew circuit 114 provides strobe deskewed output signal SDOUT at 124 that includes first strobe deskewed edges, such as one of rising edges or falling edges, and second strobe deskewed edges, such as the other of rising edges or falling edges. In one embodiment, strobe signal deskew circuit 114 is an inverting circuit that provides a falling strobe edge in strobe deskewed output signal SDOUT at 124 in response to each received rising strobe edge in strobe deskew input signal SDIN at 122, and a rising strobe edge in strobe deskewed output signal SDOUT at 124 in response to each received falling strobe edge in strobe deskew input signal SDIN at 122. In one embodiment, strobe signal deskew circuit 114 is a non-inverting circuit that provides a rising strobe edge in strobe deskewed output signal SDOUT at 124 in response to each received rising strobe edge in strobe deskew input signal SDIN at 122, and a falling strobe edge in strobe deskewed output signal SDOUT at 124 in response to each received falling strobe edge in strobe deskew input signal SDIN at 122.

Strobe signal deskew circuit 114 provides a first strobe deskewed edge in strobe deskewed output signal SDOUT at 124 in response to each received third strobe edge, and a second strobe deskewed edge in strobe deskewed output signal SDOUT at 124 in response to each received fourth strobe edge. Strobe signal deskew circuit 114 provides a third strobe delay between each received third strobe edge in strobe deskew input signal SDIN at 122 and the corresponding first strobe deskewed edge in strobe deskewed output signal SDOUT at 124 and a fourth strobe delay between each received fourth strobe edge in strobe deskew input signal SDIN at 122 and the corresponding second strobe deskewed edge in strobe deskewed output signal SDOUT at 124. The difference between the fourth strobe delay and the third strobe delay is substantially equal to the difference between the first strobe delay and the second strobe delay. Also, the first strobe delay plus the third strobe delay is substantially equal to the second strobe delay plus the fourth strobe delay.

Strobe signal deskew circuit 114 provides the third strobe delay and the fourth strobe delay to offset differences in the first strobe delay and the second strobe delay through strobe signal receiver 112. Strobe deskewed output signal SDOUT at 124 has substantially the same timing as strobe signal STROBE at 104, but delayed in time and possibly inverted. Strobe signal deskew circuit 114 can be built to offset differences in delays through strobe signal receiver 112 over process variations, temperature variations, and voltage variations.

Data sampling circuit 116 receives data deskewed output signal DDOUT at 120 and strobe deskewed output signal SDOUT at 124. Data signal DATA at 102 and strobe signal STROBE at 104 provide a data setup time before each edge of strobe signal STROBE at 104 and a data hold time after each edge of strobe signal STROBE at 104. If first data delay plus third data delay is substantially equal to second data delay plus fourth data delay that is substantially equal to first strobe delay plus third strobe delay that is substantially equal to second strobe delay plus fourth strobe delay, then data deskewed output signal DDOUT at 120 has substantially the same timing as data signal DATA at 102, but delayed in time and possibly inverted, and strobe deskewed output signal SDOUT at 124 has substantially the same timing as strobe signal STROBE at 104, but delayed the same amount of time and possibly inverted, and the setup and hold times or windows are substantially unaffected by the skew of data receiver 108 and the skew of strobe signal receiver 112. Data sampling circuit 116 receives data deskewed output signal DDOUT at 120 and strobe deskewed output signal SDOUT at 124 and provides recovered data in data output signal DATAOUT at 106.

In operation, data receiver 108 receives data signal DATA at 102 that includes first data edges and second data edges, and provides data deskew input signal DDIN at 118 that includes third data edges and fourth data edges. Data receiver 108 provides a first data delay between each received first data edge and the corresponding third data edge and a second data delay between each received second data edge and the corresponding fourth date edge.

Data deskew circuit 110 receives data deskew input signal DDIN at 118 that includes third data edges and fourth data edges, and provides data deskewed output signal DDOUT at 120 that includes first data deskewed edges and second data deskewed edges. Data deskew circuit 110 provides a third data delay between each received third data edge and the corresponding first data deskewed edge and a fourth data delay between each received fourth data edge and the corresponding second data deskewed edge. The difference between the fourth data delay and the third data delay is substantially equal to the difference between the first data delay and the second data delay. Also, the first data delay plus the third data delay is substantially equal to the second data delay plus the fourth data delay. Data deskewed output signal DDOUT at 120 has substantially the same timing as data signal DATA at 102, but delayed in time and possibly inverted.

Strobe signal receiver 112 receives strobe signal STROBE at 104 that includes first strobe edges and second strobe edges, and provides strobe deskew input signal SDIN at 122 that includes third strobe edges and fourth strobe edges. Strobe signal receiver 112 provides a first strobe delay between each received first strobe edge and the corresponding third strobe edge and a second strobe delay between each received second strobe edge and the corresponding fourth strobe edge.

Strobe signal deskew circuit 114 receives strobe deskew input signal SDIN at 122 that includes third strobe edges and fourth strobe edges, and provides strobe deskewed output signal SDOUT at 124 that includes first strobe deskewed edges and second strobe deskewed edges. Strobe signal deskew circuit 114 provides a third strobe delay between each received third strobe edge and the corresponding first strobe deskewed edge and a fourth strobe delay between each received fourth strobe edge and the corresponding second strobe deskewed edge. The difference between the fourth strobe delay and the third strobe delay is substantially equal to the difference between the first strobe delay and the second strobe delay. Also, the first strobe delay plus the third strobe delay is substantially equal to the second strobe delay plus the fourth strobe delay. Strobe deskewed output signal SDOUT at 124 has substantially the same timing as strobe signal STROBE at 104, but delayed in time and possibly inverted. Data sampling circuit 116 receives data deskewed output signal DDOUT at 120 and strobe deskewed output signal SDOUT at 124 and provides recovered data in data output signal DATAOUT at 106.

Figure 5:
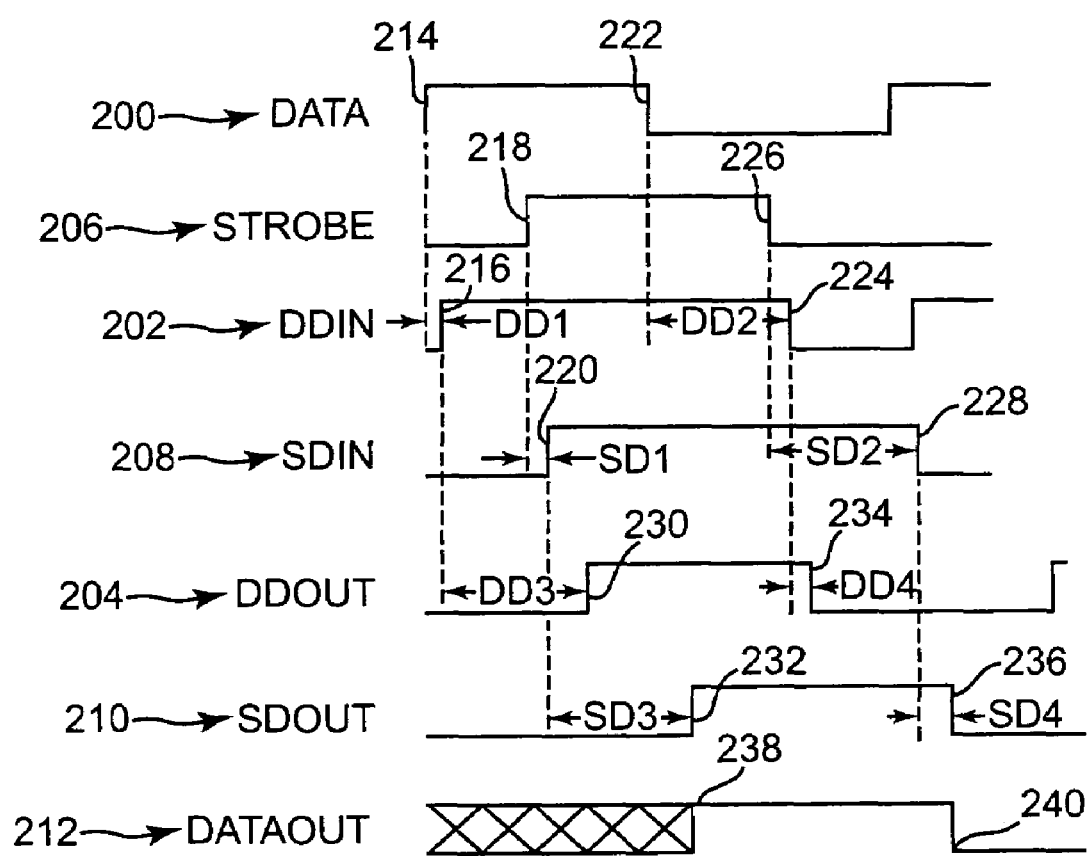
FIG. 5 is a timing diagram illustrating the operation of one embodiment of the I/O circuit of FIG. 4.

FIG. 5 is a timing diagram illustrating the operation of one embodiment of I/O circuit 100 of FIG. 4. In this embodiment, data receiver 108, data deskew circuit 110, strobe signal receiver 112, and strobe signal deskew circuit 114 are non-inverting circuits. Data receiver 108 receives data signal DATA at 200 and provides data deskew input signal DDIN at 202. Data deskew circuit 110 receives data deskew input signal DDIN at 202 and provides data deskewed output signal DDOUT at 204. Strobe signal receiver 112 receives strobe signal STROBE at 206 and provides strobe deskew input signal SDIN at 208. Strobe signal deskew circuit 114 receives strobe deskew input signal SDIN at 208 and provides strobe deskewed output signal SDOUT at 210. Data sampling circuit 116 receives data deskewed output signal DDOUT at 204 and strobe deskewed output signal SDOUT at 210 and provides recovered data in data output signal DATAOUT at 212.

To begin, data receiver 108 receives data signal DATA at 200 and strobe signal receiver 112 receives strobe signal STROBE at 206. Data receiver 108 receives a rising data edge at 214 in data signal DATA at 200 and provides a rising data edge at 216 in data deskew input signal DDIN at 202. The rising data edge at 216 is delayed a first data delay DD1 by data receiver 108 from the rising data edge at 214. Strobe signal receiver 112 receives a rising strobe edge at 218 in strobe signal STROBE at 206 and provides a rising strobe edge at 220 in strobe deskew input signal SDIN at 208. The rising strobe edge at 220 is delayed a first strobe delay SD1 by strobe signal receiver 112 from the rising strobe edge at 218. In one embodiment, the first data delay DD1 has substantially the same value as the first strobe delay SD1. In other embodiments, the first data delay DD1 and the first strobe delay SD1 have different delay values.

Data receiver 108 receives a falling data edge at 222 in data signal DATA at 200 and provides a falling data edge at 224 in data deskew input signal DDIN at 202. The falling data edge at 224 is delayed a second data delay DD2 by data receiver 108 from the falling data edge at 222. The first data delay DD1 is less than the second data delay DD2. In other embodiments, the first data delay DD1 can be substantially equal to the second data delay DD2 or greater than the second data delay DD2.

Strobe signal receiver 112 receives a falling strobe edge at 226 in strobe signal STROBE at 206 and provides a falling strobe edge at 228 in strobe deskew input signal SDIN at 208. The falling strobe edge at 228 is delayed a second strobe delay SD2 by strobe signal receiver 112 from the falling strobe edge at 226. The first strobe delay SD1 is less than the second strobe delay SD2. In other embodiments, the first strobe delay SD1 can be substantially equal to the second strobe delay SD2 or greater than the second strobe delay SD2.

Data deskew circuit 110 receives data deskew input signal DDIN at 202 and strobe deskew circuit 114 receives strobe deskew input signal SDIN at 208. Data deskew circuit 110 receives the rising data edge at 216 in data deskew input signal DDIN at 202 and provides a rising data edge at 230 in data deskewed output signal DDOUT at 204. The rising data edge at 230 is delayed a third data delay DD3 by data deskew circuit 110 from the rising data edge at 216. Strobe deskew circuit 114 receives the rising strobe edge at 220 in strobe deskew input signal SDWN at 208 and provides a rising strobe edge at 232 in strobe deskewed output signal SDOUT at 210. The rising strobe edge at 232 is delayed a third strobe delay SD3 by strobe deskew circuit 114 from the rising strobe edge at 220. In one embodiment, the third data delay DD3 has substantially the same value as the third strobe delay SD3. In other embodiments, the third data delay DD3 and the third strobe delay SD3 have different delay values.

The first data delay DD1 plus the third data delay DD3 is substantially equal to the first strobe delay SD1 plus the third strobe delay SD3. This maintains the data setup time between the rising data edge at 214 in data signal DATA at 200 and the rising strobe edge at 218 in strobe signal STROBE at 206 substantially equal to the data setup time between the rising data edge at 230 in data deskewed output signal DDOUT at 204 and the rising strobe edge at 232 in strobe deskewed output signal SDOUT at 210.

Data deskew circuit 110 receives the falling data edge at 224 in data deskew input signal DDIN at 202 and provides a falling data edge at 234 in data deskewed output signal DDOUT at 204. The falling data edge at 234 is delayed a fourth data delay DD4 by data deskew circuit 110 from the falling data edge at 224. Strobe deskew circuit 114 receives the falling strobe edge at 228 in strobe deskew input signal SDIN at 208 and provides a falling strobe edge at 236 in strobe deskewed output signal SDOUT at 210. The falling strobe edge at 236 is delayed a fourth strobe delay SD4 by strobe deskew circuit 114 from the falling strobe edge at 228. In one embodiment, the fourth data delay DD4 has substantially the same value as the fourth strobe delay SD4. In other embodiments, the fourth data delay DD4 and the fourth strobe delay SD4 have different delay values.

The second data delay DD2 plus the fourth data delay DD4 is substantially equal to the second strobe delay SD2 plus the fourth strobe delay SD4. This maintains the data setup time between the falling data edge at 222 in data signal DATA at 200 and the falling strobe edge at 226 in strobe signal STROBE at 206 substantially equal to the data setup time between the falling data edge at 234 in data deskewed output signal DDOUT at 204 and the falling strobe edge at 236 in strobe deskewed output signal SDOUT at 210.

As to the data hold time, the first strobe delay SD1 plus the third strobe delay SD3 is substantially equal to the second data delay DD2 plus the fourth data delay DD4. This maintains the data hold time between the rising strobe edge at 218 in strobe signal STROBE at 206 and the falling data edge at 222 in data signal DATA at 200 substantially equal to the data hold time between the rising strobe edge at 232 in strobe deskewed output signal SDOUT at 210 and the falling data edge at 234 in data deskewed output signal DDOUT at 204.

The first data delay DD1 plus the third data delay DD3 is substantially equal to the second data delay DD2 plus the fourth data delay DD4 and the first strobe delay SD1 plus the third strobe delay-SD3 is substantially equal to the second strobe delay SD2 plus the fourth strobe delay SD4. The time between the rising data edge at 214 and the falling data edge at 222 is substantially equal to the time between the rising data edge at 230 and the falling data edge at 234, such that data deskewed output signal DDOUT at 204 has substantially the same timing as data signal DATA at 200, but delayed in time. Also, the time between the rising strobe edge at 218 and the falling strobe edge at 226 is substantially equal to the time between the rising strobe edge at 232 and the falling strobe edge at 236, such that strobe deskewed output signal SDOUT at 210 has substantially the same timing as strobe signal STROBE at 206, but delayed in time.

Data sampling circuit 116 receives data deskewed output signal DDOUT at 204 and strobe deskewed output signal SDOUT at 210 and provides recovered data in data output signal DATAOUT at 212. Data sampling circuit 116 samples data deskewed output signal DDOUT at 204 via the rising strobe edge at 232 in strobe deskewed output signal SDOUT at 210 to provide a high logic level signal at 238. Data sampling circuit 116 samples data deskewed output signal DDOUT at 204 via the falling strobe edge at 236 in strobe deskewed output signal SDOUT at 210 to provide a low logic level signal at 240.

Figure 6:
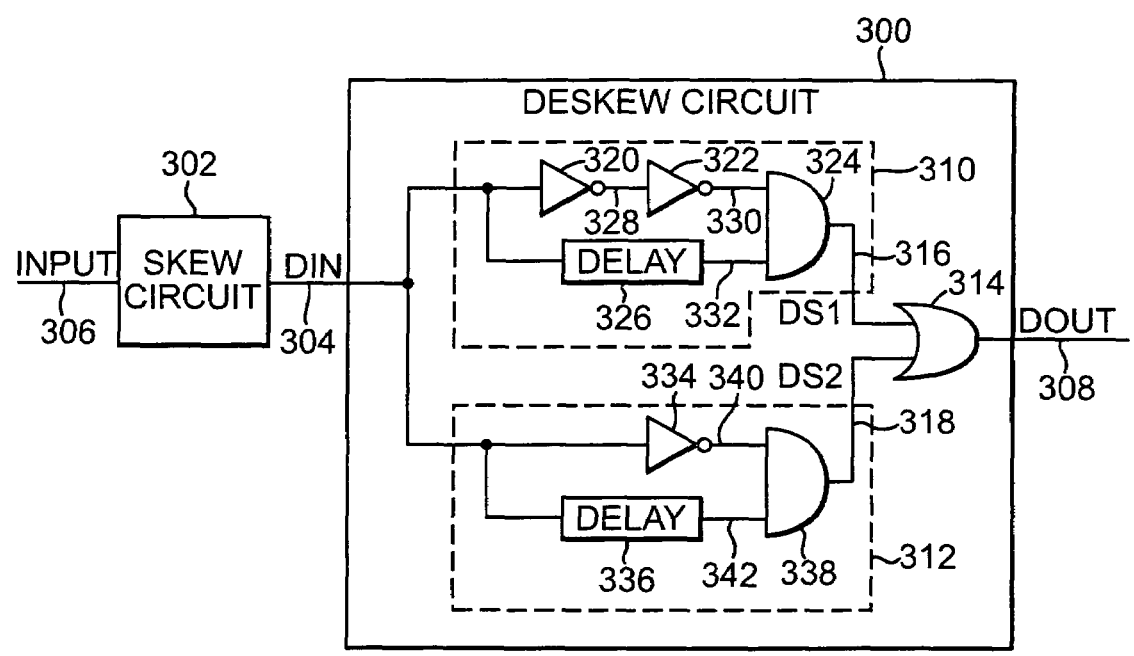
FIG. 6 is a diagram illustrating one embodiment of a deskew circuit coupled to a skew circuit.

FIG. 6 is a diagram illustrating one embodiment of a deskew circuit 300 coupled to a skew circuit 302. Deskew circuit 300 is similar to deskew circuit 28 (shown in FIG. 1) and deskew circuit 80 (shown in FIG. 2). Also, deskew circuit 300 is similar to data deskew circuit 110 and strobe signal deskew circuit 114 (shown in FIG. 4). Skew circuit 302 can be any suitable circuit that provides a first delay for one edge type, such as one of rising edges or falling edges, in an input signal and a second delay for the other edge type, such as the other one of rising edges or falling edges, in the input signal. In one embodiment, skew circuit 302 is a receiver, such as data receiver 108 or strobe signal receiver 112 (shown in FIG. 4). Deskew circuit 300 is electrically coupled to skew circuit 302 via deskew input signal communications path 304.

Skew circuit 302 receives an input signal INPUT at 306 that includes first edges, such as one of rising edges-or falling edges, and second edges, such as the other of rising edges or falling edges. Skew circuit 302 provides deskew input signal DIN on deskew input signal communications path 304. Deskew input signal DIN at 304 includes third edges, such as one of rising edges or falling edges, and fourth edges, such as the other of rising edges or falling edges. Each of the third edges is delayed from one of the first edges by a first delay and each of the fourth edges is delayed from one of the second edges by a second delay. In one embodiment, skew circuit 302 is an inverting circuit that provides a falling edge in deskew input signal DIN at 304 in response to each received rising edge, and a rising edge in deskew input signal DIN at 304 in response to each received falling edge. In one embodiment, skew circuit 302 is a non-inverting circuit that provides a rising edge in deskew input signal DIN at 304 in response to each received rising edge, and a falling edge in deskew input signal DIN at 304 in response to each received falling edge.

Deskew circuit 300 recieves the deskew input signal DIN at 304 and provides a deskewed output signal DOUT at 308. Deskewed output signal DOUT at 308 includes first deskewed edges, such as one of rising edges or falling edges, and second deskewed edges, such as the other of rising edges or falling edges. Each of the first deskewed edges is delayed from one of the third edges by a third delay and each of the second deskewed edges is delayed from one of the fourth edges by a fourth delay. The first delay plus the third delay is substantially equal to the second delay plus the fourth delay. Also, the difference between the fourth delay and the third delay is substantially equal to the difference between the first delay and the second delay.

Deskew circuit 300 provides the third delay and the fourth delay to offset the difference between the first delay and the second delay. Deskewed output signal DOUT at 308 has substantially the same timing as input signal INPUT at 306, but delayed in time and possibly inverted. Deskew circuit 300 can be built to offset differences between the first delay and the second delay over process variations, temperature variations, and voltage variations.

Deskew circuit 300 includes a rising edge delay circuit 310, a falling edge delay circuit 312, and an OR gate 314. Rising edge delay circuit 310 is electrically coupled to skew circuit 302 via deskew input signal communications path 304 and to one input of OR gate 314 via first delayed signal path 316. Falling edge delay circuit 312 is electrically coupled to skew circuit 302 via deskew input signal communications path 304 and to another input of OR gate 314 via second delayed signal path 318. OR gate 314 provides deskewed output signal DOUT at 308.

Rising edge delay circuit 310 receives deskew input signal DIN at 304 and delays the rising edges in deskew input signal DIN at 304 to provide delayed rising edges in a first delayed signal DS1 at 316. The rising edges in deskew input signal DIN at 304 are delayed one of the third delay value or the fourth delay value. Falling edge delay circuit 312 receives deskew input signal DIN at 304 and delays the falling edges in deskew input signal DIN at 304 to provide delayed falling edges in a second delayed signal DS2 at 318. The falling edges in deskew input signal DIN at 304 are delayed the other of the third delay value or the fourth delay value. OR gate 314 receives first delayed signal DS1 at 316 and second delayed signal DS2 at 318 and combines the received signals to provide deskewed output signal DOUT at 308.

Rising edge delay circuit 310 includes a first inverter 320, a second inverter 322, a first AND gate 324, and a first delay circuit 326. The input of first inverter 320 and the input of first delay circuit 326 are electrically coupled together and to skew circuit 302 via deskew input signal communications path 304. The output of first inverter 320 is electrically coupled at 328 to the input of second inverter 322 and the output of second inverter 322 is electrically coupled at 330 to one input of first AND gate 324. The output of first delay circuit 326 is electrically coupled at 332 to another input of first AND gate 324 and the output of first AND gate 324 is electrically coupled via first delayed signal path 316 to one input of OR gate 314.

Falling edge delay circuit 312 includes a third inverter 334, a second delay circuit 336, and a second AND gate 338. The input of third inverter 334 and the input of second delay circuit 336 are electrically coupled together and to skew circuit 302 via deskew input signal communications path 304. Also, the input of third inverter 334 and the input of second delay circuit 336 are electrically coupled to the input of first inverter 320 and the input of first delay circuit 326 via deskew input signal communications path 304. The output of third inverter 334 is electrically coupled at 340 to one input of second AND gate 338 and the output of second delay circuit 336 is electrically coupled at 342 to another input of second AND gate 338. The output of second AND gate 338 is electrically coupled via second delayed signal path 318 to another input of OR gate 314.

Rising edge delay circuit 310 and falling edge delay circuit 312 receive deskew input signal DIN at 304, which includes rising edges and falling edges. If deskew input signal DIN at 304 is at a low logic level and has been at a low logic level for a long enough time to propagate through first delay circuit 326, first AND gate 324 receives the low logic level and provides a low logic level in first delayed signal DS1 at 316 to OR gate 314. Also, if deskew input signal DIN at 304 is at a low logic level and has been at a low logic level for a long enough time to propagate through second delay circuit 336, second AND gate 338 receives the low logic level and provides a low logic level signal in second delayed signal DS2 at 318 to OR gate 314. With both inputs at low logic levels, OR gate 314 provides a low logic level in deskewed output signal DOUT at 308.

As deskew input signal DIN at 304 transitions from a low logic level to a high logic level in a rising edge, the output of second inverter 322 transitions from a low logic level to a high logic level and the output of third inverter 334 transitions from a high logic level to a low logic level. After a delay through first delay circuit 326, the rising edge in deskew input signal DIN at 304 propagates through first delay circuit 326, which provides a rising edge at 332 to the input of AND gate 324. The output of AND gate 324 provides a rising edge in first delayed signal DS1 at 316 to the input of OR gate 314 and the output of OR gate 314 provides a rising edge in deskewed output signal DOUT at 308. After a delay through second delay circuit 336, the rising edge in deskew input signal DIN at 304 propagates through second delay circuit 336 to the input of AND gate 338. However, with the output of third inverter 334 at a low logic level, second AND gate 338 continues to provide a low logic level signal in second delayed signal DS2 at 318 to OR gate 314.

As deskew input signal DIN at 304 transitions from a high logic level to a low logic level in a falling edge, the output of second inverter 322 transitions from a high logic level to a low logic level and the output of third inverter 334 transitions from a low logic level to a high logic level. The output of third inverter 334 transitions from a low logic level to a high logic level before the output of second inverter 322 transitions from a high logic level to a low logic level due to the extra inverter, first inverter 320, in the input signal path of second inverter 322. With the output of second delay circuit 336 at a high logic level and the output of third inverter 334 transitioning to a high logic level, AND gate 338 transitions from a low logic level to a high logic level before AND gate 324 transitions from a high logic level to a low logic level. This maintains the output of OR gate 314 at a high logic level.

After a delay through second delay circuit 336, the falling edge in deskew input signal DIN at 304 propagates through second delay circuit 336 that provides a falling edge at 342 to the input of AND gate 338. The output of AND gate 338 provides a falling edge in second delayed signal DS2 at 318 to the input of OR gate 314 and the output of OR gate 314 provides a falling edge in deskewed output signal DOUT at 308. After the delay through first delay circuit 326, the falling edge in deskew input signal DIN at 304 propagates through first delay circuit 326 to the input of AND gate 324. With the output of second inverter 322 at a low logic level, first AND gate 324 continues to provide a low logic level signal in first delayed signal DS1 at 316 to OR gate 314. The sequence repeats as deskew input signal DIN at 304 transitions from a low logic level to a high logic level in a rising edge.

In operation of one embodiment wherein skew circuit 302 is an inverting circuit, skew circuit 302 receives input signal INPUT at 306 that includes falling edges and rising edges and skew circuit 302 provides deskew input signal DIN at 304 that includes rising edges and falling edges, respectively. Each of the rising edges in deskew input signal DIN at 304 is delayed from one of the falling edges in input signal INPUT at 306 by a first delay and each of the falling edges in deskew input signal DIN at 304 is delayed from one of the rising edges in input signal INPUT at 306 by a second delay.

Deskew circuit 300 recieves the deskew input signal DIN at 304 that includes rising edges and falling edges and provides the deskewed output signal DOUT at 308 that includes rising edges and falling edges, respectively. Each of the rising edges in deskewed output signal DOUT at 308 is delayed from one of the rising edges in deskew input signal DIN at 304 by a third delay and each of the falling edges in deskewed output signal DOUT at 308 is delayed from one of the falling edges in deskew input signal DIN at 304 by a fourth delay.

Rising edge delay circuit 310 and falling edge delay circuit 312 receive deskew input signal DIN at 304. If deskew input signal DIN at 304 is at a low logic level and has been at a low logic level long enough to propagate through first delay circuit 326, first AND gate 324 receives the low logic level and provides a low logic level in first delayed signal DS1 at 316 to OR gate 314. Also, if deskew input signal DIN at 304 is at a low logic level and has been at a low logic level long enough to propagate through second delay circuit 336, second AND gate 338 receives the low logic level and provides a low logic level signal in second delayed signal DS2 at 318 to OR gate 314. With both inputs at low logic levels, OR gate 314 provides a low logic level in deskewed output signal DOUT at 308.

As deskew input signal DIN at 304 transitions from a low logic level to a high logic level in a rising edge, the output of second inverter 322 transitions from a low logic level to a high logic level and the output of third inverter 334 transitions from a high logic level to a low logic level. After a delay through first delay circuit 326, the first delay circuit 326 provides a rising edge at 332 to the input of AND gate 324 that provides a rising edge in first delayed signal DS1 at 316 to the input of OR gate 314. The output of OR gate 314 provides a first deskewed rising edge in deskewed output signal DOUT at 308. The first deskewed rising edge in deskewed output signal DOUT at 308 is delayed the third delay from the rising edge in deskew input signal DIN at 304 via the first delay circuit 326.

As deskew input signal DIN at 304 transitions from a high logic level to a low logic level in a falling edge, the output of second inverter 322 transitions from a high logic level to a low logic level and the output of third inverter 334 transitions from a low logic level to a high logic level. The output of third inverter 334 transitions from a low logic level to a high logic level before the output of second inverter 322 transitions from a high logic level to a low logic level due to the extra inverter, first inverter 320, in the input signal path of second inverter 322. With the output of second delay circuit 336 at a high logic level and the output of third inverter 334 transitioning to a high logic level, AND gate 338 transitions from a low logic level to a high logic level before AND gate 324 transitions from a high logic level to a low logic level. This maintains the output of OR gate 314 at a high logic level.

After a delay through second delay circuit 336, the second delay circuit 336 provides a falling edge at 342 to the input of AND gate 338 and the output of AND gate 338 provides a falling edge in second delayed signal DS2 at 318 to the input of OR gate 314. The output of OR gate 314 provides a second deskewed falling edge in deskewed output signal DOUT at 308. The second deskewed falling edge in deskewed output signal DOUT at 308 is delayed a fourth delay from the falling edge in deskew input signal DIN at 304 via the second delay circuit 336. The sequence repeats as input signal INPUT at 306 provides rising and falling edges.

Each of the first deskewed rising edges is delayed from one of the rising edges in deskew input signal DIN at 304 by a third delay and each of the second deskewed falling edges is delayed from one of the falling edges in deskew input signal DIN at 304 by a fourth delay. The first delay plus the third delay is substantially equal to the second delay plus the fourth delay. Also, the difference between the fourth delay and the third delay is substantially equal to the difference between the first delay and the second delay.

Deskew circuit 300 provides the third delay and the fourth delay to offset the difference between the first delay and the second delay. Deskewed output signal DOUT at 308 has substantially the same timing as input signal INPUT at 306, but delayed in time and inverted. Also, deskew circuit 300 can be built to offset differences between the first delay and the second delay over process variations, temperature variations, and voltage variations.

Figure 7:
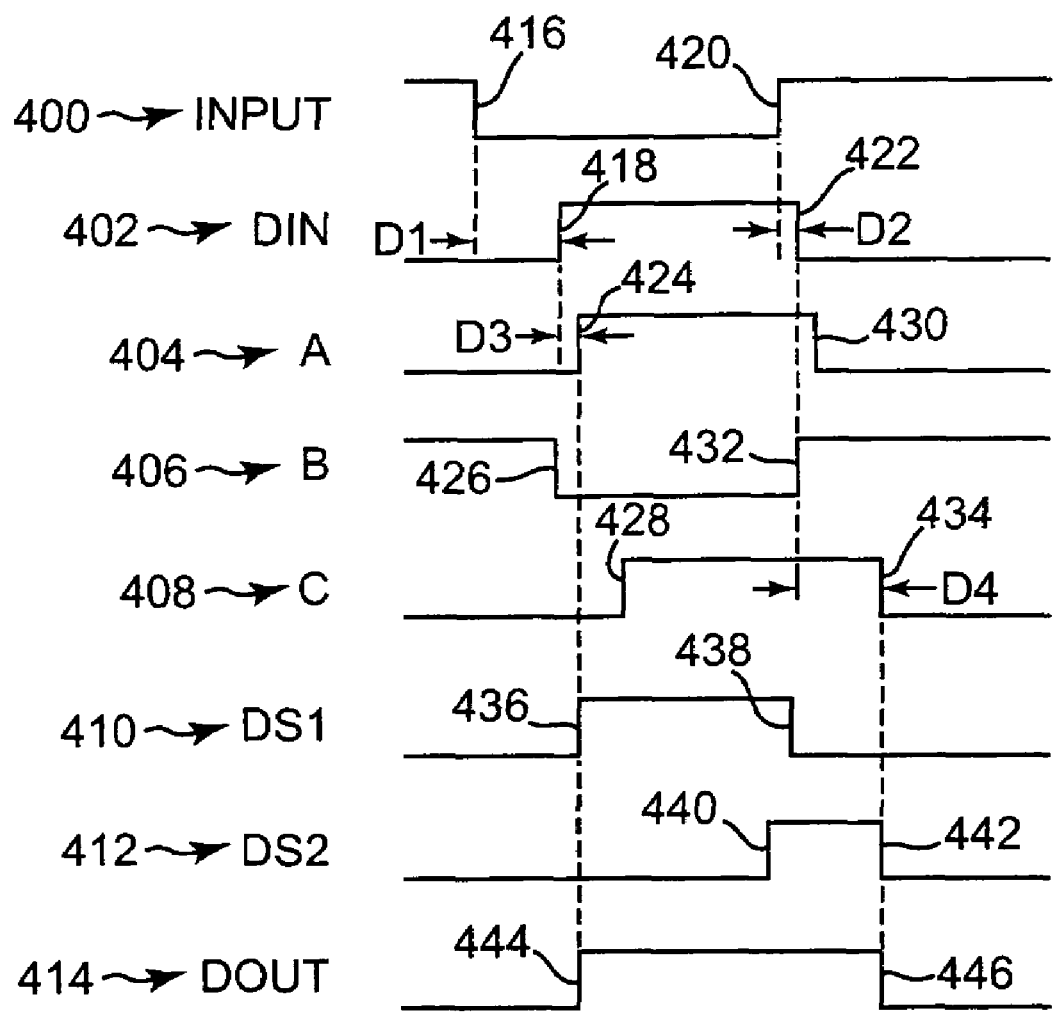
FIG. 7 is a timing diagram illustrating the operation of one embodiment of a skew circuit and a deskew circuit.

FIG. 7 is a timing diagram illustrating the operation of one embodiment of a skew circuit 302 and a deskew circuit 300 (shown in FIG. 6). In this embodiment, skew circuit 302 is an inverting circuit and deskew circuit 300 is a non-inverting circuit. Skew circuit 302 receives input signal INPUT at 400 and provides deskew input signal DIN at 402. First delay circuit 326 receives deskew input signal DIN at 402 and provides signal A at 404. Also, third inverter 334 receives deskew input signal DIN at 402 and provides signal B at 406 and second delay circuit 336 receives deskew input signal DIN at 402 and provides signal C at 408. First AND gate 324 receives signal A and provides first delayed signal DS1 at 410. Second AND gate 338 receives signal B at 406 and signal C at 408 and provides second delayed signal DS2 at 412. OR gate 314 receives first delayed signal DS1 at 410 and second delayed signal DS2 at 412 and provides deskewed output signal DOUT at 414.

To begin, skew circuit 302 receives input signal INPUT at 400. Skew circuit 302 receives a falling edge at 416 in input signal INPUT at 400 and provides a rising edge at 418 in deskew input signal DIN at 402. The rising edge at 418 is delayed a first delay D1 by skew circuit 302 from the falling edge at 416. Skew circuit 302 receives a rising edge at 420 in input signal INPUT at 400 and provides a falling edge at 422 in deskew input signal DIN at 402. The falling edge at 422 is delayed a second delay D2 by skew circuit 302 from the rising edge at 420. The first delay D1 is greater than the second delay D2. In other embodiments, the first delay D1 can be substantially equal to the second delay D2 or less than the second delay D2.

Deskew circuit 300 receives deskew input signal DIN at 402. First delay circuit 326 receives the rising edge at 418 in deskew input signal DIN at 402 and provides a rising edge at 424 in signal A at 404. The rising edge at 424 is delayed substantially the third delay D3 by first delay circuit 326 from the rising edge at 418. Third inverter 334 receives the rising edge at 418 in deskew input signal DIN at 402 and provides a falling edge at 426 in signal B at 406, and second delay circuit 336 receives the rising edge at 418 in deskew input signal DIN at 402 and provides a rising edge at 428 in signal C at 408.

First delay circuit 326 receives the falling edge at 422 in deskew input signal DIN at 402 and provides a falling edge at 430 in signal A at 404. Third inverter 334 receives the falling edge at 422 in deskew input signal DIN at 402 and provides a rising edge at 432 in signal B at 406, and second delay circuit 336 receives the falling edge at 422 in deskew input signal DIN at 402 and provides a falling edge at 434 in signal C at 408. The falling edge at 434 is delayed substantially the fourth delay D4 by second delay circuit 336 from the falling edge at 422.

First AND gate 324 receives signal A at 404 and a non-inverted signal that is similar to deskew input signal DIN at 402 from second inverter 322. First AND gate 324 receives the rising edge at 424 in signal A at 404 and provides a rising edge at 436 in first delayed signal DS1 at 410. The rising edge at 436 in first delayed signal DS1 at 410 is substantially delayed the first delay D1 plus the third delay D3 from the falling edge at 416 in input signal INPUT at 400. First AND gate 324 receives a falling edge from second inverter 322, which is similar to the falling edge at 422 in deskew input signal DIN at 402 and provides a falling edge at 438 in first delayed signal DS1 at 410. The falling edge at 438 is delayed two inverter delays and one AND gate delay from the falling edge at 422 in deskew input signal DIN at 402.

Second AND gate 338 receives signal B at 406 and signal C at 408. Second AND gate 338 receives the rising edge at 432 in signal B at 406 and provides a rising edge at 440 in second delayed signal DS2 at 412. The rising edge at 440 is delayed one inverter delay and one AND gate delay from the falling edge at 422 in deskew input signal DIN at 402 and the rising edge at 440 occurs before the falling edge at 438 to maintain deskewed output signal DOUT at 414 at a high logic level. Second AND gate 338 receives the falling edge at 434 in signal C at 408 and provides a falling edge at 442 in second delayed signal DS2 at 412. The falling edge at 442 in second delayed signal DS2 at 412 is substantially delayed the second delay D2 plus the fourth delay D4 from the rising edge at 420 in input signal INPUT at 400.

OR gate 314 receives first delayed signal DS1 at 410 and second delayed signal DS2 at 412 and provides deskewed output signal DOUT at 414. OR gate 314 receives the rising edge at 436 in first delayed signal DS1 at 410 and provides a rising edge at 444 in deskewed output signal DOUT at 414. OR gate 314 receives the falling edge at 442 in second delayed signal DS2 at 412 and provides a falling edge at 446 in deskewed output signal DOUT at 414. The rising edge at 444 is substantially delayed the first delay D1 plus the third delay D3 from the falling edge at 416 in input signal INPUT at 400, and the falling edge at 446 is substantially delayed the second delay D2 plus the fourth delay D4 from the rising edge at 420 in input signal INPUT at 400. The first delay plus the third delay is substantially equal to the second delay plus the fourth delay. Also, the difference between the fourth delay and the third delay is substantially equal to the difference between the first delay and the second delay. The deskewed output signal DOUT at 414 has substantially the same timing as the input signal INPUT at 400, but deskewed output signal DOUT at 414 is delayed in time and inverted from input signal INPUT at 400.

Figure 8:
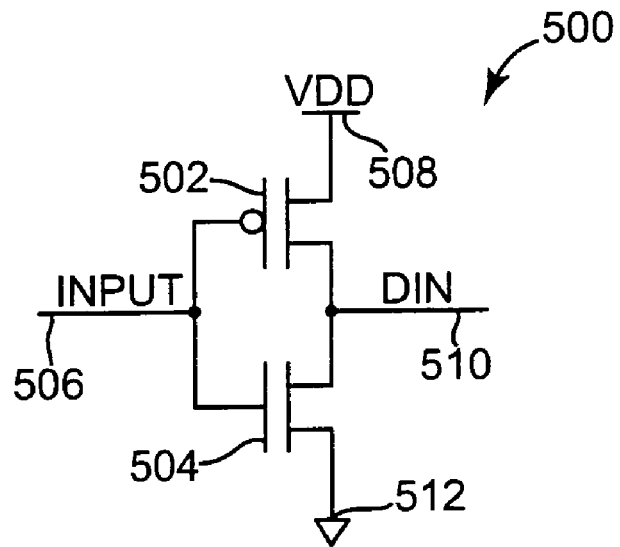
FIG. 8 is a diagram illustrating one embodiment of an input receiver.

FIG. 8 is a diagram illustrating one embodiment of an input receiver 500. Input receiver 500 is similar to data receiver 108 and strobe receiver 112 (shown in FIG. 4) and skew circuit 302 (shown in FIG. 6). Input receiver 500 includes a p-channel metal oxide semiconductor (PMOS) transistor 502 and an n-channel metal oxide semiconductor (NMOS) transistor 504. The gate of PMOS transistor 502 is electrically coupled to the gate of NMOS transistor 504 via input communications path 506. One side of the drain-source path of PMOS transistor 502 is electrically coupled to a power supply, such as VDD, at 508. The other side of the drain-source path of PMOS transistor 502 is electrically coupled to one side of the drain-source path of NMOS transistor 504 via output communications path 510. The other side of the drain-source path of NMOS transistor 504 is electrically coupled to a reference, such as ground, at 512.

Input receiver 500 receives input signal INPUT at 506 and provides deskew input signal DIN at 510. Input receiver 500 receives a falling edge in input signal INPUT at 506. A low logic level in input signal INPUT at 506 turns on PMOS transistor 502 and turns off NMOS transistor 504 to provide a rising edge in deskew input signal DIN at 510. The rising edge in deskew input signal DIN at 510 is delayed a first delay from the falling edge in input signal INPUT at 506. Input receiver 500 receives a rising edge in input signal INPUT at 506. A high logic level in input signal INPUT at 506 turns off PMOS transistor 502 and turns on NMOS transistor 504 to provide a falling edge in deskew input signal DIN at 510. The falling edge in deskew input signal DIN at 510 is delayed a second delay from the rising edge in input signal INPUT at 506. The first delay and the second delay can be different delay values, such that timing in deskew input signal DIN at 510 is skewed from the timing in input signal INPUT at 506.

Figure 9:
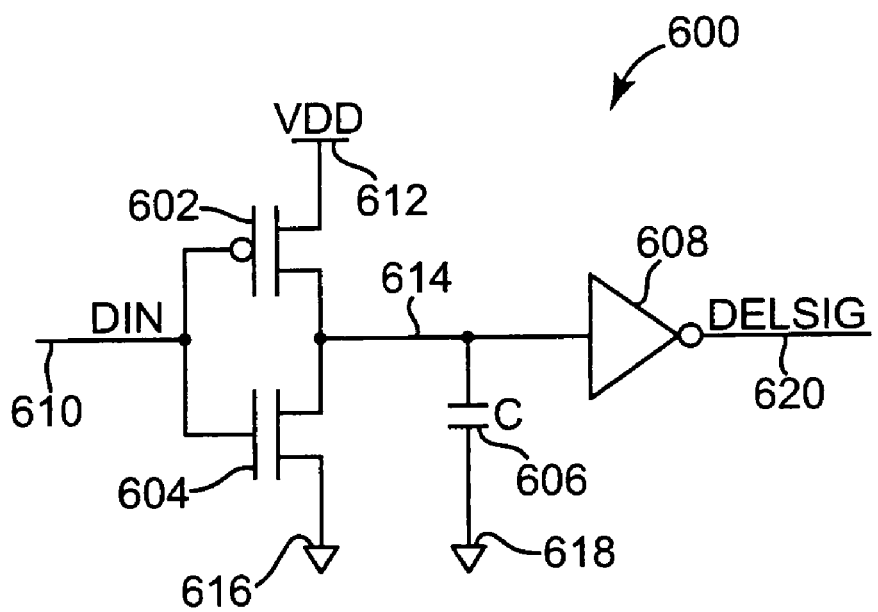
FIG. 9 is a diagram illustrating one embodiment of a delay circuit.

FIG. 9 is a diagram illustrating one embodiment of a delay circuit 600. Delay circuit 600 is similar to first delay circuit 326 and second delay circuit 336 (shown in FIG. 6). Delay circuit 600 includes a PMOS transistor 602, an NMOS transistor 604, a capacitor 606, and an inverter 608. The gate of PMOS transistor 602 is electrically coupled to the gate of NMOS transistor 604 via deskew input communications path 610. One side of the drain-source path of PMOS transistor 602 is electrically coupled to a power supply, such as VDD, at 612. The other side of the drain-source path of PMOS transistor 602 is electrically coupled to one side of the drain-source path of NMOS transistor 604 via internal communications path 614. The other side of the drain-source path of NMOS transistor 604 is electrically coupled to a reference, such as ground, at 616. Also, the other side of the drain-source path of PMOS transistor 602 is electrically coupled to one side of capacitor 606 and to the input of inverter 608 via internal communications path 614. The other side of capacitor 606 is electrically coupled to a reference, such as ground, at 618. The output of inverter 608 provides the delayed signal DELSIG at 620.

Delay circuit 600 receives deskew input signal DIN at 610 and provides delayed signal DELSIG at 620. Delay circuit 600 receives a rising edge in deskew input signal DIN at 610 and provides a rising edge in delayed signal DELSIG at 620. A high logic level in deskew input signal DIN at 610 turns off PMOS transistor 602 and turns on NMOS transistor 604 to provide a falling edge on internal communications path 614. Inverter 608 receives the falling edge and provides a rising edge in delayed signal DELSIG at 620. The rising edge in delayed signal DELSIG at 620 is delayed from the rising edge in deskew input signal DIN at 610 by a delay value that is set by the capacitance value C of capacitor 606. If delay circuit 600 is used as first delay circuit 326, the delay value is set to substantially equal the third delay.

Delay circuit 600 receives a falling edge in deskew input signal DIN at 610 and provides a falling edge in delayed signal DELSIG at 620. A low logic level in deskew input signal DIN at 610 turns on PMOS transistor 602 and turns off NMOS transistor 604 to provide a rising edge on internal communications path 614. Inverter 608 receives the rising edge and provides a falling edge in delayed signal DELSIG at 620. The falling edge in delayed signal DELSIG at 620 is delayed from the falling edge in deskew input signal DIN at 610 by a delay value that is set by the capacitance value C of capacitor 606. If delay circuit 600 is used as second delay circuit 336, the delay time is set to substantially equal the fourth delay.

In one embodiment of skew circuit 302 and deskew circuit 300 (shown in FIG. 6), input receiver 500 of FIG. 8 is used in place of skew circuit 302, one embodiment of delay circuit 600 that provides a third delay is used in place of first delay circuit 326, and another embodiment of delay circuit 600 that provides a fourth delay is used in place of second delay circuit 336. The first delay through input receiver 500 plus the third delay is substantially equal to the second delay through input receiver 500 plus the fourth delay. Also, the difference between the fourth delay and the third delay is substantially equal to the difference between the first delay and the second delay. Deskew circuit 300 provides the third delay and the fourth delay to offset the difference between the first delay and the second delay through input receiver 500. The deskewed output signal DOUT at 308 is substantially the same as input signal INPUT at 306, but delayed in time and inverted.

The change in values of the third delay and the fourth delay over process variations, temperature variations, and voltage variations track the change in values of the first delay and the second delay over process variations, temperature variations, and voltage variations. Deskew circuit 300 including input receiver 500 in place of skew circuit 302, one embodiment of delay circuit 600 that provides a third delay in place of first delay circuit 326, and another embodiment of delay circuit 600 that provides a fourth delay in place of second delay circuit 336, compensates for the first delay and the second delay over process variations, temperature variations, and voltage variations to provide the deskewed output signal DOUT at 308. Also, deskew circuit 300 is reliable and consumes little power.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A circuit comprising:
   a skew circuit configured to receive an input signal and provide a deskew input signal, wherein the skew circuit asymmetrically delays rising and falling edges of the input signal to produce the deskew input signal, such that the deskew input signal has a first edge delayed from a second edge of the input signal by a first delay and a third edge delayed from a fourth edge of the input signal by a second delay that is different than the first delay; and
   a deskew circuit configured to receive the deskew input signal, wherein the deskew circuit asymmetrically delays rising and falling edges of the deskew input signal to provide an output signal having a first deskewed edge delayed from the first edge by a third delay and a second deskewed edge delayed from the third edge by a fourth delay, wherein the difference between the fourth delay and the third delay is substantially equal to the difference between the first delay and the second delay.

2. The circuit of claim 1, wherein the third delay is substantially equal to the second delay and the fourth delay is substantially equal to the first delay.

3. The circuit of claim 1, wherein the deskew circuit comprises:
   a first circuit configured to receive the deskew input signal and provide a first delayed edge in a first delayed signal;
   a second circuit configured to receive the deskew input signal and provide a second delayed edge in a second delayed signal; and
   a third circuit configured to provide the first deskewed edge in response to the first delayed edge and the second deskewed edge in response to the second delayed edge.

4. The circuit of claim 1, wherein the deskew circuit comprises:
   a first delay circuit configured to provide the third delay; and
   a second delay circuit configured to provide the fourth delay.

5. The circuit of claim 1, wherein the skew circuit comprises:
   a complementary metal oxide semiconductor skew circuit.

6. An electronic system, comprising:
   a random access memory including an input/output circuit comprising:
      a first circuit configured to receive a first data signal and asymmetrically delay rising and falling edges of the first data signal to produce a second data signal, wherein the first data signal has a first edge and a second edge and the second data signal has a third edge delayed from the first edge by a first delay and a fourth edge delayed from the second edge by a second delay that is different than the first delay; and
      a second circuit configured to receive the second data signal, wherein the second circuit asymmetrically delays rising and falling edges of the second data signal to provide a third data signal having a first deskewed edge delayed from the third edge by a third delay and a second deskewed edge delayed from the fourth edge by a fourth delay, wherein the first delay plus the third delay is substantially equal to the second delay plus the fourth delay.

7. The electronic system of claim 6, wherein the input/output circuit comprises:
   a third circuit configured to receive a first strobe signal and asymmetrically delay rising and falling edges of the first strobe signal to produce a second strobe signal, wherein the first strobe signal has a first strobe edge and a second strobe edge and the second strobe signal has a third strobe edge delayed from the first strobe edge by a first strobe delay and a fourth strobe edge delayed from the second strobe edge by a second strobe delay that is different than the first strobe delay; and
   a fourth circuit configured to receive the second strobe signal, wherein the fourth circuit asymmetrically delays rising and falling edges of the second strobe signal to provide a third strobe signal having a first deskewed strobe edge delayed from the third strobe edge by a third strobe delay and a second deskewed strobe edge delayed from the fourth strobe edge by a fourth strobe delay, wherein the first strobe delay plus the third strobe delay is substantially equal to the second strobe delay plus the fourth strobe delay.

8. The electronic system of claim 7, wherein each of the first and second deskewed strobe edges of the third strobe signal are used to sample the third data signal to recover data.

9. The electronic system of claim 7, wherein the first delay plus the third delay is substantially equal to the first strobe delay plus the third strobe delay.

10. The electronic system of claim 6, wherein the third delay is substantially equal to the second delay and the fourth delay is substantially equal to the first delay.

11. A circuit, comprising:
a first circuit configured to receive a first signal and asymmetrically delay rising and falling edges of the first signal to produce a second signal, wherein the first signal has a first edge and a second edge and the second signal has a first rising edge delayed from the first edge by a first delay and a first falling edge delayed from the second edge by a second delay that is different than the first delay; and
a second circuit configured to receive the second signal, wherein the second circuit asymmetrically delays rising and falling edges of the second signal to provide a third signal having a second rising edge delayed from the first rising edge by a third delay and a second falling edge delayed from the first falling edge by a fourth delay, wherein the second circuit comprises:
a third circuit configured to receive the second signal and delay the first rising edge to provide a delayed first rising edge;
a fourth circuit configured to receive the second signal and delay the first falling edge to provide a delayed first falling edge; and
a fifth circuit configured to provide the second rising edge in response to the delayed first rising edge and the second falling edge in response to the delayed first falling edge, wherein the difference between the fourth delay and the third delay is substantially equal to the difference between the first delay and the second delay.

12. The circuit of claim 11, wherein the third circuit comprises a first delay circuit that includes a first complementary metal oxide semiconductor inverter circuit and the fourth circuit comprises a second delay circuit that includes a second complementary metal oxide semiconductor inverter circuit.

13. The circuit of claim 12, wherein the first circuit comprises:
a third complementary metal oxide semiconductor inverter circuit.

14. A circuit comprising:
means for receiving an input signal and asymmetrically delaying rising and falling edges of the input signal to produce a deskew input signal that has a first edge delayed from a second edge of the input signal by a first delay and a third edge delayed from a fourth edge of the input signal by a second delay that is different than the first delay;
means for receiving the deskew input signal;
means for delaying the first edge to provide a first deskewed edge that is delayed a first deskewed delay from the first edge; and
means for delaying the third edge to provide a second deskewed edge that is delayed a second deskewed delay from the third edge, wherein the difference between the second deskewed delay and the first deskewed delay is substantially equal to the difference between the first delay and the second delay.

15. The circuit of claim 14, comprising;
means for combining the first deskewed edge and the second deskewed edge to provide a deskewed signal.

16. The circuit of claim 14, wherein the means for delaying the first edge comprises a first complementary metal oxide semiconductor inverter circuit, and the means for delaying the third edge comprises a second complementary metal oxide semiconductor inverter circuit.

17. A method for deskewing, comprising:
receiving an input signal;
delaying rising and falling edges of the input signal asymmetrically to produce a deskew input signal that has a first edge delayed from a second edge of the input signal by a first delay, and a third edge delayed from a fourth edge of the input signal by a second delay that is different than the first delay;
delaying the first edge a third delay to provide a first deskewed edge; and
delaying the third edge a fourth delay to provide a second deskewed edge, wherein the difference between the fourth delay and the third delay is substantially equal to the difference between the first delay and the second delay.

18. The method of claim 17, wherein the third delay is substantially equal to the second delay and the fourth delay is substantially equal to the first delay.

19. The method of claim 17, comprising;
combining the first deskewed edge and the second deskewed edge to provide a deskewed signal.

20. The method of claim 17, wherein:
delaying the first edge comprises delaying the first edge via a first complementary metal oxide semiconductor circuit; and
delaying the third edge comprises delaying the third edge via a second complementary metal oxide semiconductor circuit.

21. A method for recovering data in a random access memory, comprising:
receiving a first data signal having a first edge and a second edge at a first circuit;
delaying the edges of the first data signal asymmetrically to produce a second data signal;
delaying the first edge by a first delay to provide a third edge in the second data signal;
delaying the second edge by a second delay that is different than the first delay to provide a fourth edge in the second data signal;
receiving the second data signal at a second circuit;
delaying the third edge by a third delay to provide a first deskewed edge in a third data signal; and
delaying the fourth edge by a fourth delay to provide a second deskewed edge in the third signal, wherein the first delay plus the third delay is substantially equal to the second delay plus the fourth delay.

22. The method of claim 21, comprising:
receiving a first strobe signal having a first strobe edge and a second strobe edge at a third circuit;
delaying the edges of the first strobe signal asymmetrically to produce a second strobe signal;
delaying the first strobe edge by a first strobe delay to provide a third strobe edge in the second strobe signal;
delaying the second strobe edge by a second strobe delay that is different than the first strobe delay to provide a fourth strobe edge in the second strobe signal;
receiving the second strobe signal at a fourth circuit;
delaying the third strobe edge by a third strobe delay to provide a first deskewed strobe edge in a third strobe signal; and
delaying the fourth strobe edge by a fourth strobe delay to provide a second deskewed strobe edge in the third strobe signal, wherein the first strobe delay plus the third strobe delay is substantially equal to the second strobe delay plus the fourth strobe delay.

23. The method of claim 22, comprising:
sampling the third data signal via the first deskewed strobe edge of the third strobe signal to recover data; and
sampling the third data signal via the second deskewed strobe edge of the third strobe signal to recover data.

24. The method of claim 22, wherein the first delay plus the third delay is substantially equal to the first strobe delay plus the third strobe delay.

25. The method of claim 21, wherein the third delay is substantially equal to the second delay and the fourth delay is substantially equal to the first delay.

26. A method for deskewing, comprising:
receiving a first signalhaving a first edge and a second edge at a first circuit;
delaying the edges of the first signal asymmetrically to produce a second signal;
delaying the first edge by a first delay to provide a first rising edge in the second signal;
delaying the second edge by a second delay that is different than the first delay to provide a first falling edge in the second signal;
receiving the second signal at a second circuit;
delaying the first rising edge by a third delay in a third circuit to provide a second rising edge in a first delayed signal;
delaying the first falling edge by a fourth delay in a fourth circuit to provide a second falling edge in a second delayed signal; and
combining the first delayed signal and the second delayed signal to provide a third signal, wherein the difference between the fourth delay and the thrid delay is substantially equal to the difference between the first delay and the second delay.

27. Thge method of claim 26, wherein:
delaying the first rising edge comprises delaying the first rising edge via a first complementary metal oxide semiconductor inverter circuit; and
delaying the first falling edge comprises delaying the first falling edge via a second complementary metal oxide semiconductor inverter circuit.

28. The method of claim 26, wherein:
delaying the first edge by a first delay comprises delaying the first edge by a first delay via a complementary metal oxide semiconductor inverter circuit; and
delaying the second edge by a second delay comprises delaying the second edge by a second delay via the complementary metal oxide semiconductor inverter circuit.

* * * * *